(12) United States Patent
Choi et al.

(10) Patent No.: US 11,733,921 B2
(45) Date of Patent: Aug. 22, 2023

(54) MEMORY DEVICE AND MEMORY SYSTEM INCLUDING THE SAME

(71) Applicant: SK hynix Inc., Icheon-si (KR)

(72) Inventors: Won Jae Choi, Icheon-si (KR); Jea Won Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 12 days.

(21) Appl. No.: 17/244,060

(22) Filed: Apr. 29, 2021

(65) Prior Publication Data

US 2022/0129197 A1    Apr. 28, 2022

(30) Foreign Application Priority Data

Oct. 26, 2020    (KR) .......................... 10-2020-0139606

(51) Int. Cl.
 *G11C 16/24*    (2006.01)
 *G06F 3/06*    (2006.01)
 (Continued)

(52) U.S. Cl.
 CPC .......... *G06F 3/0659* (2013.01); *G06F 3/0604* (2013.01); *G06F 3/0652* (2013.01);
 (Continued)

(58) Field of Classification Search
 CPC .... G06F 3/0659; G06F 3/0604; G06F 3/0652; G06F 3/0656; G06F 3/0683;
 (Continued)

(56) References Cited

U.S. PATENT DOCUMENTS 10,114,562 B2    10/2018 Ravimohan et al.
2006/0050314 A1*    3/2006 Shiga .................. G11C 16/102
                                                                   358/1.16

(Continued)

FOREIGN PATENT DOCUMENTS

KR         101543433 B1    8/2015
KR      1020190089365 A    7/2019
KR      1020210046454 A    4/2021

OTHER PUBLICATIONS

Akira Fukuda, Kioxia and WD announce technical outline of ultra-high-speed flash "XL-FLASH" at ISSCC, Mar. 4, 2020, PC Watch.

*Primary Examiner* — Hoai V Ho
*Assistant Examiner* — Minh Dinh
(74) *Attorney, Agent, or Firm* — William Park & Associates Ltd.

(57) ABSTRACT

The present technology relates to a memory device. A memory device according to the present technology may include a plurality of planes, individual operation controllers configured to respectively control read operations on the plurality of planes, a common operation controller configured to control a program operation or an erase operation on any one of the plurality of planes, a command decoder configured to provide a read command among the plurality of commands to an individual operation controller that controls a plane that is indicated by an address that corresponds to the read command among the individual operation controllers, and configured to provide a program command or an erase command among the plurality of commands to the common operation controller, and a peripheral circuit configured to generate operation voltages that are used for the read operations, the program operation, and the erase operation.

18 Claims, 15 Drawing Sheets

(51) Int. Cl.
  *G11C 16/04*   (2006.01)
  *G11C 16/08*   (2006.01)
  *G11C 16/10*   (2006.01)
  *G11C 16/16*   (2006.01)
  *G11C 16/26*   (2006.01)
(52) U.S. Cl.
  CPC .......... *G06F 3/0656* (2013.01); *G06F 3/0683* (2013.01); *G11C 16/0483* (2013.01); *G11C 16/08* (2013.01); *G11C 16/10* (2013.01); *G11C 16/16* (2013.01); *G11C 16/24* (2013.01); *G11C 16/26* (2013.01); *G11C 2216/22* (2013.01)
(58) Field of Classification Search
  CPC ..... G11C 16/0483; G11C 16/08; G11C 16/10; G11C 16/16; G11C 16/24; G11C 16/26; G11C 2216/22; G11C 16/30; G11C 16/32; G11C 2216/24
  USPC ........................................................ 365/154
  See application file for complete search history.

(56) References Cited

U.S. PATENT DOCUMENTS

| | | |
|---|---|---|
| 2012/0179883 A1 | 7/2012 | Ma |
| 2018/0197967 A1* | 7/2018 | Oh .................... H01L 27/11565 |
| 2019/0227719 A1* | 7/2019 | Park ........................ G06F 3/061 |
| 2020/0151117 A1* | 5/2020 | Um ........................ G06F 3/064 |
| 2021/0305268 A1* | 9/2021 | Sato ................. H01L 27/11573 |

* cited by examiner

MEMORY DEVICE AND MEMORY SYSTEM INCLUDING THE SAME

CROSS-REFERENCE TO RELATED APPLICATION

The present application claims priority under 35 U.S.C. § 119(a) to Korean patent application number 10-2020-0139606 filed on Oct. 26, 2020, in the Korean intellectual Property Office, the entire disclosure of which is incorporated by reference herein.

BACKGROUND

1. Technical Field

The present disclosure relates to an electronic device, and more particularly, to a memory device and a memory system including the same.

2. Related Art

A memory system is a device that stores data based on a host device such as a computer or a smartphone. The memory system may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include a plurality of planes each with a plurality of memory cells, individual operation controllers configured to respectively control read operations on the plurality of planes, a common operation controller configured to control a program operation or an erase operation on any one of the plurality of planes, a command decoder configured to receive a plurality of commands and addresses that respectively correspond to the plurality of commands from a memory controller, configured to provide a read command among the plurality of commands to an individual operation controller that controls a plane that is indicated by an address that corresponds to the read command among the individual operation controllers, and configured to provide a program command or an erase command among the plurality of commands to the common operation controller, and a peripheral circuit configured to generate operation voltages that are used for the read operations, the program operation, and the erase operation based on the individual operation controllers and the common operation controller.

A memory device according to an embodiment of the present disclosure may include a memory cell array with a plurality of planes, a peripheral circuit configured to perform a read operation, a program operation, or an erase operation on memory cells that are included in the plurality of planes, respectively, and a control logic configured to control the memory cell array and the peripheral circuit to perform an operation that corresponds to at least two commands, in parallel, when receiving the at least two commands among a program command that initiates the program operation on the plurality of planes, an erase command that initiates the erase operation on the plurality of planes, and a read command that initiates the read operation on the plurality of planes from a memory controller. When a subsequent command that initiates a further program operation is input while the program operation is being performed, the control logic may hold a start of the further program operation that corresponds to the subsequent command, and when a subsequent command that initiates a further erase operation is input while the erase operation is being performed, the control logic may hold a start of the further erase operation that corresponds to the subsequent command.

A memory device according to an embodiment of the present disclosure may include a plurality of planes, each with a plurality of memory cells, individual operation controllers configured to respectively control read operations on the plurality of planes, a common operation controller configured to control a program operation or an erase operation on any one of the plurality of planes, wherein different operations are capable of being respectively performed on different planes among the plurality of planes at the same time.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

In the present specification, an expression that a specific operation is "simultaneously" performed is used, this may mean that some of an operation times are overlapped. The expression may mean that a specific operation is "simultaneously" performed even in the case in which some time points of the specific operation are different.

Hereinafter, embodiments of the present disclosure will be described in detail with reference to the accompanying drawings, so that those skilled in the art to which the present disclosure pertains may easily carry out the technical spirit of the present disclosure.

An embodiment of the present disclosure provides a memory device in which a plurality of planes may independently perform an internal operation, and a memory system with the memory device.

Figure 1:
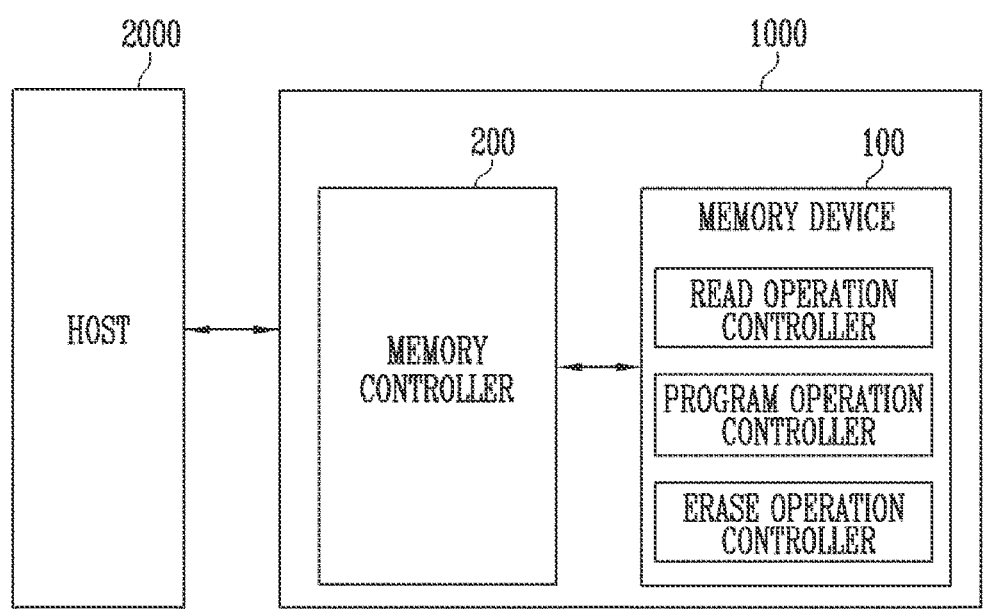
FIG. 1 is a block diagram illustrating a memory system according to an embodiment of the present disclosure.

FIG. 1 is a block diagram illustrating a memory system according to an embodiment of the present disclosure.

Referring to FIG. 1, the memory system 1000 may include a memory device 100 and a memory controller 200.

The memory system 1000 may be a device that stores data based on a host 2000 such as a cellular phone, a smartphone, an MP3 player, a laptop computer, a desktop computer, a game player, a display device, a tablet PC, or an in-vehicle infotainment system.

The memory system 1000 may be implemented as any one of various types of memory systems according to a host interface that is a communication method with the host 2000. For example, the memory system 1000 may be implemented as any one of various types of memory systems such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 1000 may be implemented as any one of various types of packages. For example, the memory system 1000 may be implemented as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data or use the stored data. Specifically, the memory device 100 may operate based on the memory controller 200. In addition, the memory device 100 may include a plurality of memory dies, and each of the plurality of memory dies may include a memory cell array with a plurality of memory cells storing data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each memory block may include a plurality of memory cells, and one memory block may include a plurality of pages. Here, a page may be one unit for storing data in the memory device 100 or reading the data that is stored in the memory device 100, According to an embodiment, the memory cell array may include a plurality of planes.

The memory device 100 may be implemented as a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (DRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may receive a command and an address from the memory controller 200. The memory device 100 may be configured to access an area selected by the received address among the memory cell array, Accessing the selected area may mean performing an operation that corresponds to the received command on the selected area. For example, the memory device 100 may perform a write operation (a program operation), a read operation, and an erase operation. Here, the program operation may be an operation in which the memory device 100 writes data to the area selected by the address. The read operation may mean an operation in which the memory device 100 reads data from the area selected by the address. The erase operation may mean an operation in which the memory device 100 erases data that is stored in the area selected by the address.

According to an embodiment of the present disclosure, the memory device 100 may include a read operation controller, a program operation controller, and an erase operation controller. The read operation controller, the program operation controller, and the erase operation controller may be configurations that perform an internal operation based on a command that is received from the memory controller 200. Specifically, when receiving a read command from the memory controller 200, the read operation controller may control the memory device 100 to perform an operation of reading data from the area selected by the address. When receiving a program command from the memory controller 200, the program operation controller may control the memory device 100 to perform an operation of writing data to the area selected by the address. When receiving an erase command from the memory controller 200, the erase operation controller may control the memory device 100 to perform an operation of erasing data that is stored in the area selected by the address.

The memory controller 200 may execute firmware (FW) when power is applied to the memory system 1000. The firmware (FW) may include a host interface layer (HIL) that receives a request input from the host 2000 or outputs a response to the host 2000, a flash translation layer (FTL) that manages an operation between an interface of the host 2000 and an interface of the memory device 100, and a flash interface layer (FIL) that provides a command to the memory device 100 or receives a response from the memory device 100.

The memory controller 200 may receive data and a logical address (LA) from the host 2000, and convert the LA into a physical address (PA) indicating an address of memory cells that are included in the memory device 100 in which data is to be stored. The LA may be a logical block address (LBA), and the PA may be a physical block address (PBA).

The memory controller 200 may control the memory device 100 to perform the program operation, the read operation, the erase operation, or the like according to the request of the host 2000. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation by itself regardless of the request from the host 2000. For example, the memory controller 200 may control the memory device 100 to perform the program operation, the read operation, or the erase operation used to perform a background operation such as wear leveling, garbage collection, and read reclaim.

According to an embodiment of the present disclosure, when the memory device 100 performs any one internal operation among the program operation, the read operation, or the erase operation, the memory controller 200 may control the memory device 100 to perform another internal operation. The memory controller 200 may control the memory device 100 to perform an interleaving operation. That is, the memory controller 200 may control the memory device 100 so that the memory device 100 simultaneously accesses a plurality of planes and performs different internal operations.

The host 2000 may communicate with the memory system 1000 by using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
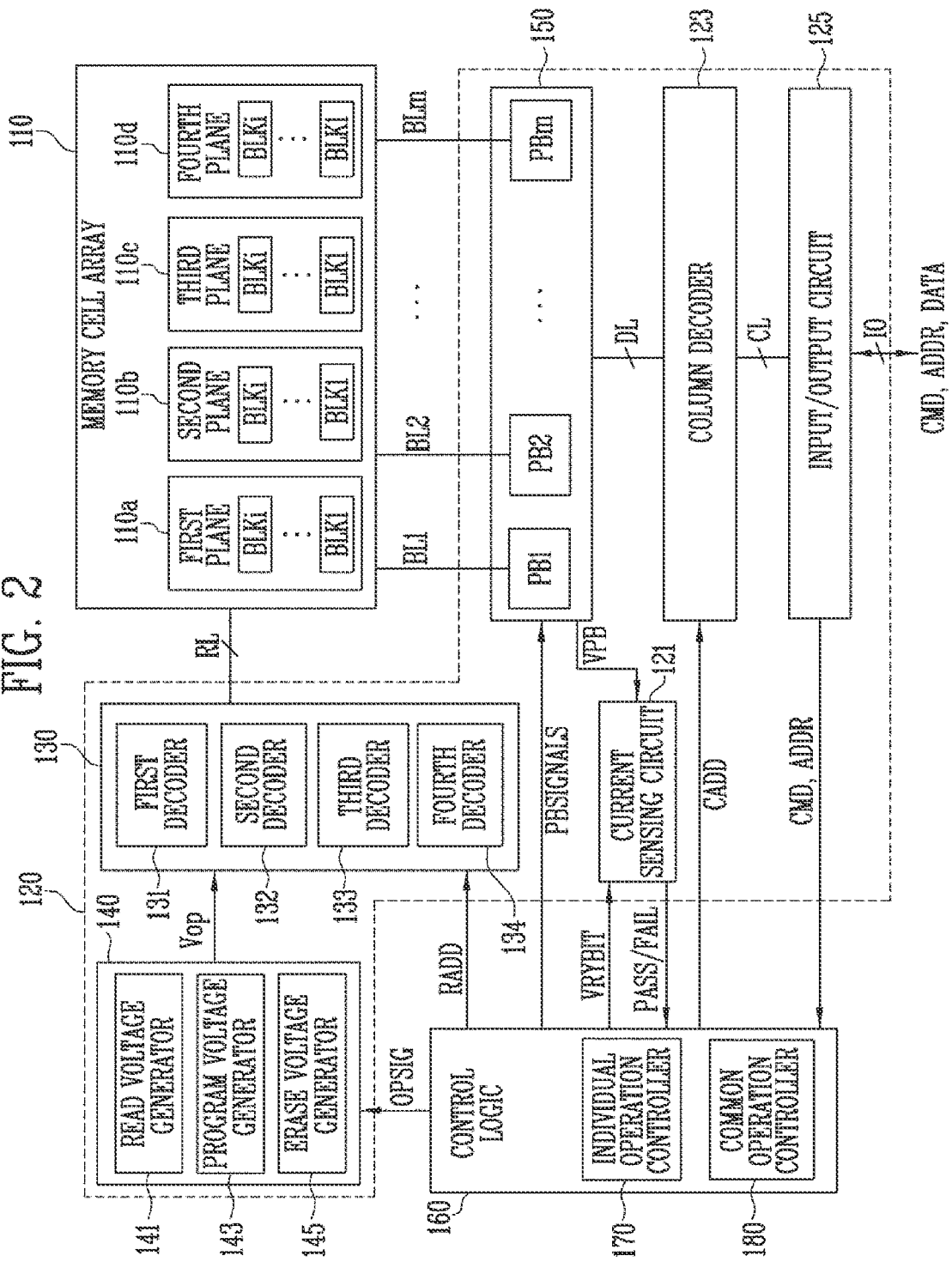
FIG. 2 is a block diagram illustrating a memory device according to an embodiment of the present disclosure.

FIG. 2 is a block diagram illustrating the memory device according to an embodiment of the present disclosure.

Referring to FIG. 2, the memory device 100 may include a memory cell array 110, a peripheral circuit 120, and a control logic 160.

The memory cell array 110 may include a plurality of planes. In addition, the plurality of planes may include a first plane 110a, a second plane 110b, a third plane 110c, and a fourth plane 110d. Each of the first planes 110a to the fourth planes 110d may include a plurality of memory blocks BLK1 to BLKi. The plurality of memory blocks BLK1 to BLKi that are included in each plane may be connected to a row decoder 130 that corresponds to the respective memory blocks BLK1 to BLKi through the row lines RL. For example, the plurality of memory blocks BLK1 to BLKi that are included in the first plane 110a may be connected to a first decoder 131 through the row lines RL.

The plurality of memory blocks BLK1 to BLKi may be connected to a page buffer group 150 through bit lines BL1 to BLm. Each of the plurality of memory blocks BLK1 to BLKi may include a plurality of memory cells. In addition, the plurality of memory cells may be nonvolatile memory cells. Memory cells connected to the same word line may be defined as one page. Therefore, one memory block may include a plurality of pages. The row lines RL may include at least one source select line, a plurality of word lines, and at least one drain select line.

Each of the memory cells that are included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on the selected area of the memory cell array 110 based on the control logic 160. That is, the peripheral circuit 120 may drive the memory cell array 110 based on the control logic 160. For example, the peripheral circuit 120 may apply various operation voltages to the row lines RL and the bit lines BL1 to BLn or discharge the applied voltages based on the control logic 160, According to an embodiment of the present disclosure, the peripheral circuit 120 may independently perform the read operation, the program operation, or the erase operation on the memory cells that are included in each of the plurality of planes.

The peripheral circuit 120 may include the row decoder 130, a voltage generation circuit 140, a current sensing circuit 121, a column decoder 123, and an input/output circuit 125 to independently perform the read operation, the program operation, or the erase operation on the memory cells that are included in each of the plurality of planes.

The row decoder 130 may include a plurality of decoders that correspond to the plurality of planes. Specifically, the row decoder 130 may include the first decoder 131, a second decoder 132, a third decoder 133, and a fourth decoder 134, and each of the decoders may correspond to one of the first plane 110a to the fourth plane 110d. The row decoder 130 may be connected to the memory cell array 110 through the row lines RL. According to an embodiment of the present disclosure, the plurality of decoders that are included in the row decoder 130 may be connected to the plurality of planes, respectively. Specifically, the first decoder 131 may be connected to the plurality of memory blocks BLK1 to BLKi that are included in the first plane 110a through the row lines RL. In addition, the second decoder 132 may be connected to the plurality of memory blocks BLK1 to BLKi that are included in the second plane 110b through the row lines RL. The third decoder 133 may be connected to the plurality of memory blocks BLK1 to BLKi that are included in the third plane 110c through the row lines RL. The fourth decoder 134 may be connected to the plurality of memory blocks BLK1 to BLKi that are included in the fourth plane 110d through the row lines RL. In addition, the row lines RL may include at least one source select line, a plurality of word lines, and at least one drain select line. In an embodiment, the word lines may include normal word lines and dummy word lines. In addition, the row lines RL may further include a pipe select line.

The row decoder 130 may be configured to operate based on the control logic 160. The row decoder 130 may receive a row address RADD from the control logic 160. Specifically, the row decoder 130 may be configured to decode the row address RADD. The row decoder 130 may select at least one of the memory blocks BLK1 to BLKz that are included in the plurality of planes according to a decoded address.

In addition, the row decoder 130 may select at least one word line of the selected memory block to apply the voltages generated by the voltage generation circuit 140 to at least one word line according to the decoded address. According to an embodiment of the present disclosure, the row decoder 130 may select any one of the plurality of planes according to the decoded address, and apply the voltages generated by the voltage generation circuit 140 to at least one word line WL by using a decoder that corresponds to the selected plane. According to an embodiment of the present disclosure, the row decoder 130 may select the first decoder 131 according to the decoded address, and apply the voltages generated by the voltage generation circuit 140 to the plurality of memory blocks BLK1 to BLKi that are included in the first plane 110a by using the first decoder 131.

In an embodiment, during the program operation, the row decoder 130 may apply a program voltage to a selected word line and apply a program pass voltage of a level lower than that of the program voltage to an unselected word line. During a program verify operation, the row decoder 130 may apply a verify voltage to the selected word line and a verify pass voltage higher than the verify voltage to the unselected word line, During the read operation, the row decoder 130 may apply a read voltage to the selected word line and apply a read pass voltage higher than the read voltage to the unselected word line.

In an embodiment, the erase operation of the memory cell array 110 may be performed in a memory block unit. During the erase operation, the row decoder 130 may select one memory block according to the decoded address, and the row decoder 130 may apply a ground voltage to word lines connected to the selected memory block.

The voltage generation circuit 140 may operate based on the control logic 160. Specifically, the voltage generation circuit 140 may be configured to generate a plurality of voltages by using an external power voltage supplied to the memory device 100 based on the control logic 160. For example, the voltage generation circuit 140 may generate the program voltage, the verify voltage, the pass voltage, the read voltage, the erase voltage, and the like based on the control logic 160. That is, the voltage generation circuit 140 may generate various operation voltages Vop used for the program, read, and erase operations in response to an operation signal OPSIG.

In addition, the voltage generation circuit 140 may generate an internal power voltage by regulating the external power voltage. The internal power voltage generated by the voltage generation circuit 140 may be used as an operation voltage of the memory cell array 110. The voltage generation circuit 140 may generate a plurality of voltages by using the external power voltage or the internal power voltage. For example, the voltage generation circuit 140 may include a plurality of pumps that receive the internal power voltage and may selectively activate the plurality of pumps to generate the plurality of voltages, based on the control logic 160, In addition, the generated voltages may be supplied to the memory cell array 110 by the row decoder 130.

According to an embodiment of the present disclosure, the voltage generation circuit 140 may include a read voltage generator 141, a program voltage generator 143, and an erase voltage generator 145. The read voltage generator 141 may generate voltages that are used for the read operation. The program voltage generator 143 may generate voltages that are used for the program operation. The erase voltage generator 145 may generate voltages that are used for the erase operation.

The current sensing circuit 121 may generate a reference current in response to a permission bit signal VRYBIT during a read operation or a verify operation, may compare a sensing voltage VPB that is received from the page buffer group 150 and a reference voltage that is generated by the reference current, and may output a pass signal PASS or a fail signal FAIL.

The page buffer group 150 may include first to m-th page buffers PB1 to PBm. The first to m-th page buffers PB1 to PBm may be connected to the memory cell array 110 through the first to m-th bit lines BL1 to BLm, respectively. In addition, the first to m-th page buffers PB1 to PBm may operate based on the control logic 160.

Specifically, the first to m-th page buffers PB1 to PBm may operate in response to page buffer control signals PBSIGNALS. For example, the first to m-th page buffers PB1 to PBm may temporarily store data that is received through the first to m-th bit lines BL1 to BLm or may sense a voltage or a current of the bit lines BL1 to BLm during the read or verify operation.

Specifically, during the program operation, when a program pulse is applied to the selected word line, the first to m-th page buffers PB1 to PBm may transfer data DATA that is received through the input/output circuit 125 to the selected memory cell through the first to m-th bit lines BL1 to BLm. The memory cells of the selected page may be programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained.

During the program verify operation, the first to m-th page buffers PB1 to PBm may read page data from the selected memory cells through the first to m-th bit lines BL1 to BLm.

During the read operation, the first to m-th page buffers PB1 to PBm may read the data DATA from the memory cells of the selected page through the first to m-th bit lines BL1 to BLm, and output the read data DATA to the input/output circuit 125 based on the column decoder 123.

During the erase operation, the first to m-th page buffers PB1 to PBm may float the first to m-th bit lines BL1 to BLm.

The column decoder 123 may transfer data between the input/output circuit 125 and the page buffer group 150 in response to a column address CADD. For example, the column decoder 123 may exchange data with the first to m-th page buffers PB1 to PBm through data lines DL or may exchange data with the input/output circuit 125 through column lines CL.

The input/output circuit 125 may transfer the command CMD and the address ADDR that are received from the memory controller 200 to the control logic 160 or may exchange the data DATA with the column decoder 123.

The control logic 160 may output the operation signal OPSIG, the row address RADD, the page buffer control signals PBSIGNALS, and the permission bit signal VRYBIT in response to the command CMD and the address ADDR to control the peripheral circuit 120. In addition, the control logic 160 may determine whether the verity operation for the internal operation passed or failed in response to the pass signal PASS or the fail signal FAIL.

According to an embodiment of the present disclosure, the control logic 160 may include an individual operation controller 170 and a common operation controller 180. In addition, the individual operation controller 170 may control the peripheral circuit 120 to independently perform the read operations on the first plane 110a to the fourth plane 110d. In addition, the common operation controller 180 may control the peripheral circuit 120 to independently perform the program operation and the erase operation on the first plane 110a to the fourth plane 110d. A specific characteristic of the individual operation controller 170 and the common operation controller 180 is described in detail with reference to FIG. 3.

Figure 3:
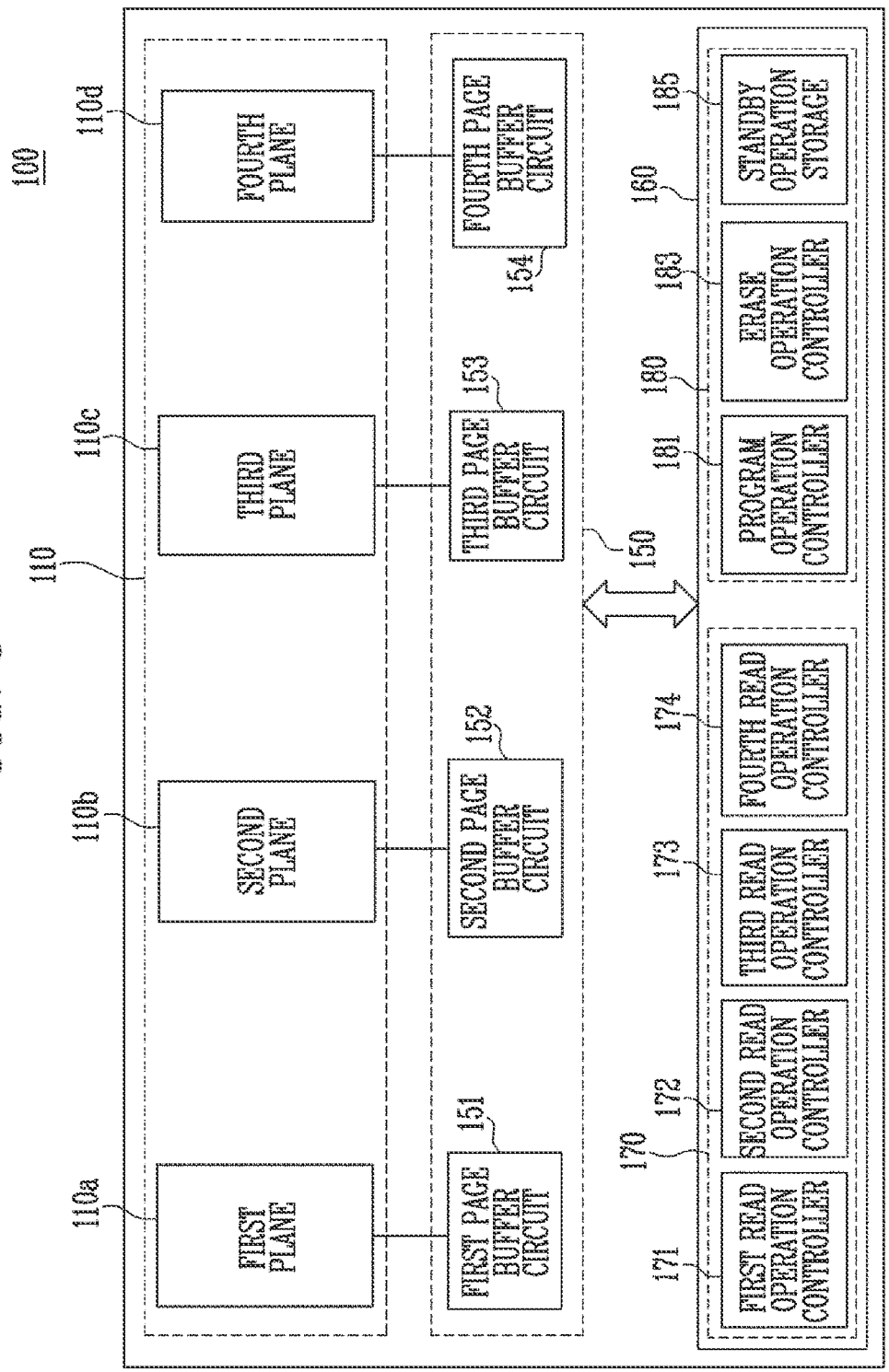
FIG. 3 is a block diagram illustrating a specific operation of a control logic according to an embodiment of the present disclosure.

FIG. 3 is a block diagram illustrating a specific operation of a control logic according to an embodiment of the present disclosure.

Referring to FIG. 3, the memory device 100 with the memory cell array 110, the page buffer group 150, and the control logic 160 is shown.

The memory cell array 110 and the page buffer group 150 may be divided into a plurality of planes and a plurality of page buffer circuits that are connected through the bit line BL respectively. That is, the memory cell array 110 and the page buffer group 150 may be paired and operate in one plane unit. For example, the first plane 110a and a first page buffer circuit 151 may form a pair and operate in a plane unit, the second plane 110b and a second page buffer circuit 152 may form a pair and operate in a plane unit, the third plane 110c and a third page buffer circuit 153 may form a pair and operate in a plane unit, and the fourth plane 110d and a fourth page buffer circuit 154 may form a pair and operate in a plane unit. The memory cell array 110 and the plurality of page buffer circuits that are included in the memory device 100 may be divided into a plurality of corresponding pairs, and each of the pairs may independently operate as one unit.

The control logic 160 may include the individual operation controller 170 and the common operation controller 180. In addition, the control logic 160 may control the peripheral circuit 120 to independently perform the read operation, the program operation, or the erase operation on the memory cells that are included in each of the plurality of planes by using the individual operation controller 170 and the common operation controller 180. For example, the control logic 160 may control the peripheral circuit 120 to perform the read operation on the first plane 110a and the second plane 110b by using the individual operation controller 170.

The individual operation controller 170 may include a first read operation controller 171 to a fourth read operation controller 174, The individual operation controller 170 may control the peripheral circuit 120 to independently perform the read operation for each plane by using the first read operation controller 171 to the fourth read operation controller 174. Specifically, the read operation controllers that are included in the individual operation controller 170 may respectively correspond to the plurality of planes, and each of the read operation controllers may control the read operation that is performed on the corresponding planes.

For example, the first read operation controller 171 may correspond to the first plane 110a and may control the read operation that is performed on the first plane 110a. The second read operation controller 172 may correspond to the second plane 110b and may control the read operation that is performed on the second plane 110b. The third read operation controller 173 may correspond to the third plane 110c and may control the read operation that is performed on the third plane 110c, The fourth read operation controller 174 may correspond to the fourth plane 110d and may control the read operation that is performed on the fourth plane 110d.

Since the individual operation controller 170 respectively controls the read operations that are performed on each of the plurality of planes, the read operations may be independently performed for each plane.

The common operation controller 180 may include a program operation controller 181, an erase operation controller 183, and a standby operation storage 185.

The program operation controller 181 may control the peripheral circuit 120 to independently perform the program operation on the plurality of planes. Specifically, the program operation controller 181 may control the program operations that are performed on the first plane 110a to the fourth plane 110d by using the peripheral circuit 120. In addition, the program operation controller 181 may control the peripheral circuit 120 so that the program operation is independently performed regardless of whether another internal operation (for example, the erase operation or the read operation) is performed.

The program operation controller 181 may control the memory cell array 110 and the peripheral circuit 120 to simultaneously start the program operations that are performed on two or more planes. For example, the program operation controller 181 may control the first page buffer circuit 151 and the second page buffer circuit 152 to simultaneously start the program operation on the first plane 110a and the second plane 110b.

The erase operation controller 183 may control the peripheral circuit 120 to independently perform the erase operation on the plurality of planes. Specifically, the erase operation controller 183 may control the erase operations that are performed on the first plane 110a to the fourth plane 110d by using the peripheral circuit 120. In addition, the erase operation controller 183 may control the peripheral circuit 120 so that the erase operation is independently performed regardless of whether another internal operation (for example, the program operation or the read operation) is performed.

The erase operation controller 183 may control the memory cell array 110 and the peripheral circuit 120 to simultaneously start the erase operations that are performed on two or more planes. For example, the erase operation controller 183 may control the first page buffer circuit 151 and the second page buffer circuit 152 to simultaneously start the erase operation on the first plane 110a and the second plane 110b.

The standby operation storage 185 may store an input program command when the program operation controller 181 is operating. Alternatively, the standby operation storage 185 may store an input erase command when the erase operation controller 183 is operating. Specifically, when the program operation is in progress, the program operation controller 181 may start another program operation after the program operation that is in progress has ended. In addition, when the erase operation is in progress, the erase operation controller 183 may start another erase operation after the erase operation that is in progress has ended. The standby operation storage 185 may store a program command that is input while the program operation is being performed and may store an erase command that is input while the erase operation is being performed. In addition, when a subsequent command that initiates the program operation is input while the program operation is being performed, the standby operation storage 185 may hold the start of the program operation that corresponds to the subsequent command. In addition, when a subsequent command that initiates the erase operation is input while the erase operation is being performed, the standby operation storage 185 may hold the start of the erase operation that corresponds to the subsequent command.

Meanwhile, when a subsequent command that initiates the erase operation or the read operation is input while the program operation is being performed, the control logic 160 may control the peripheral circuit 120 to perform the erase operation or the read operation that corresponds to the subsequent command. In addition, when a subsequent command that initiates the program operation or the read operation is input while the erase operation is being performed, the control logic 160 controls the peripheral circuit 120 to perform the program operation or the read operation that corresponds to the subsequent command. In addition, when a subsequent command that initiates the program operation, the erase operation, or the read operation is input while the read operation is being performed, the control logic 160 may control the peripheral circuit 120 to perform the program operation, the erase operation, or the read operation that corresponds to the subsequent command.

Figure 4:
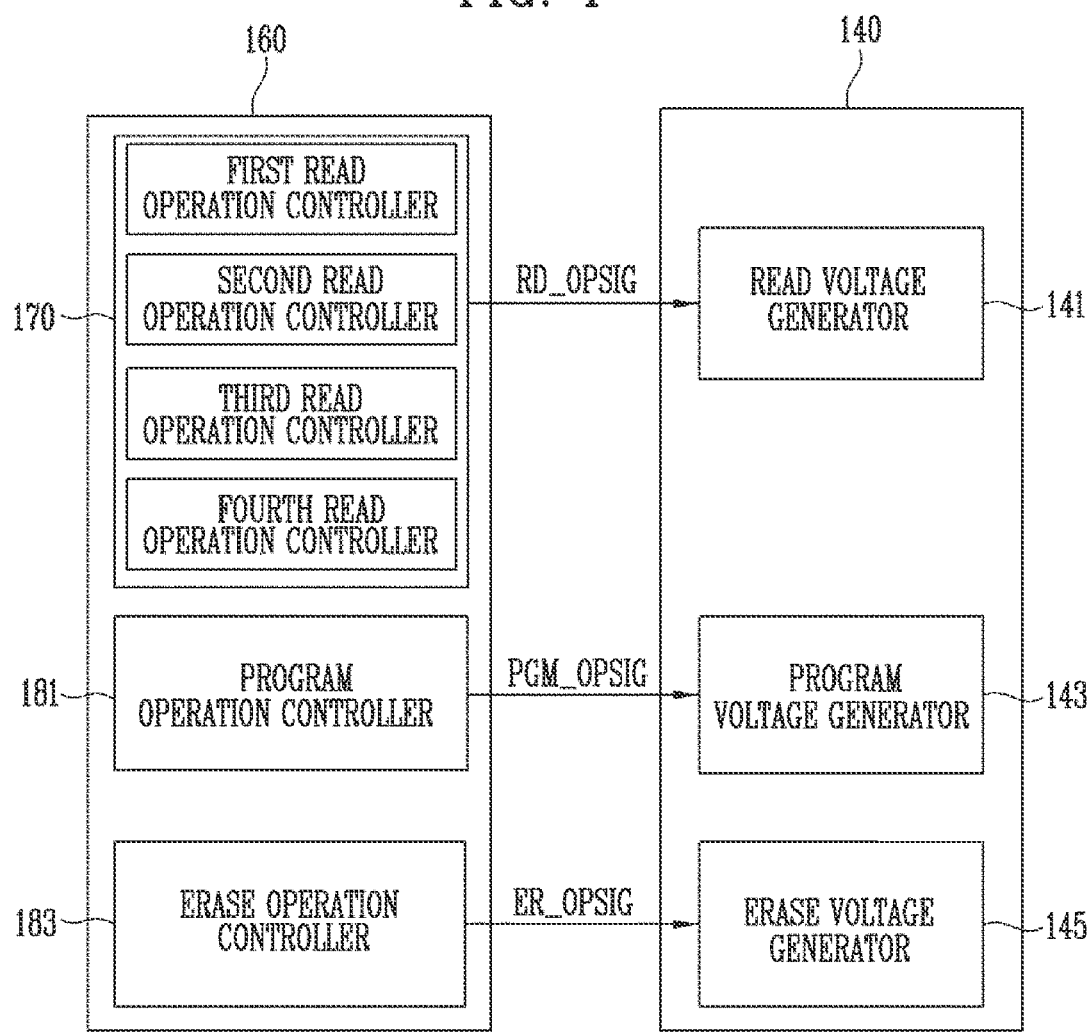
FIG. 4 is a block diagram illustrating a specific operation of a voltage generation circuit according to an embodiment of the present disclosure.

FIG. 4 is a block diagram illustrating a specific operation of a voltage generation circuit according to an embodiment of the present disclosure.

Referring to FIG. 4, the voltage generation circuit 140 with a read voltage generator 141, a program voltage generator 143, and an erase voltage generator 145 is shown.

The voltage generation circuit 140 may operate based on the control logic 160 with the individual operation controller 170, the program operation controller 181, and the erase operation controller 183. Specifically, the read voltage generator 141 may generate the voltages that are used for the read operation in response to a read operation signal RD_OPSIG of the first to fourth read operation controllers that are included in the individual operation controller 170. As described with reference to FIG. 3, the first to fourth read operation controllers that are included in the individual operation controller 170 may be configurations for controlling the read operation that is performed in each plane, and the read voltage generator 141 may generate the voltages that are used for the read operation that is performed on the first plane 110a in response to the read operation signal RD_OPSIG of the first read operation controller 171. In addition, the read voltage generator 141 may generate the voltages that are usec for the read operation that is performed on the second plane 110b to the fourth plane 110d in response to the read operation signal RD_OPSIG of the second read operation controller 172 to the fourth read operation controller 174.

The program voltage generator 143 may generate the voltages that are used for the program operation based on the program operation controller 181, Specifically, the program operation controller 181 may be a configuration for independently controlling the program operation, and the program voltage generator 143 may independently generate the voltages that are used for the program operation in response to a program operation signal PGM_OPSIG of the program operation controller 181, That is, the program voltage generator 143 may independently generate the voltages that are used for the program operation regardless of whether another internal operation (for example, the erase operation or the read operation) is performed.

The erase voltage generator 145 may generate the voltages that are used for the erase operation based on the erase operation controller 183. Specifically, the erase operation controller 183 may be a configuration for independently controlling the erase operation, and the erase voltage generator 145 may independently generate the voltages that are used for the erase operation in response to an erase operation signal ER OPSIG of the erase operation controller 183. That is, the erase voltage generator 145 may independently generate the voltages that are used for the erase operation regardless of whether another internal operation (for example, the program operation or the read operation) is performed.

Figure 5:
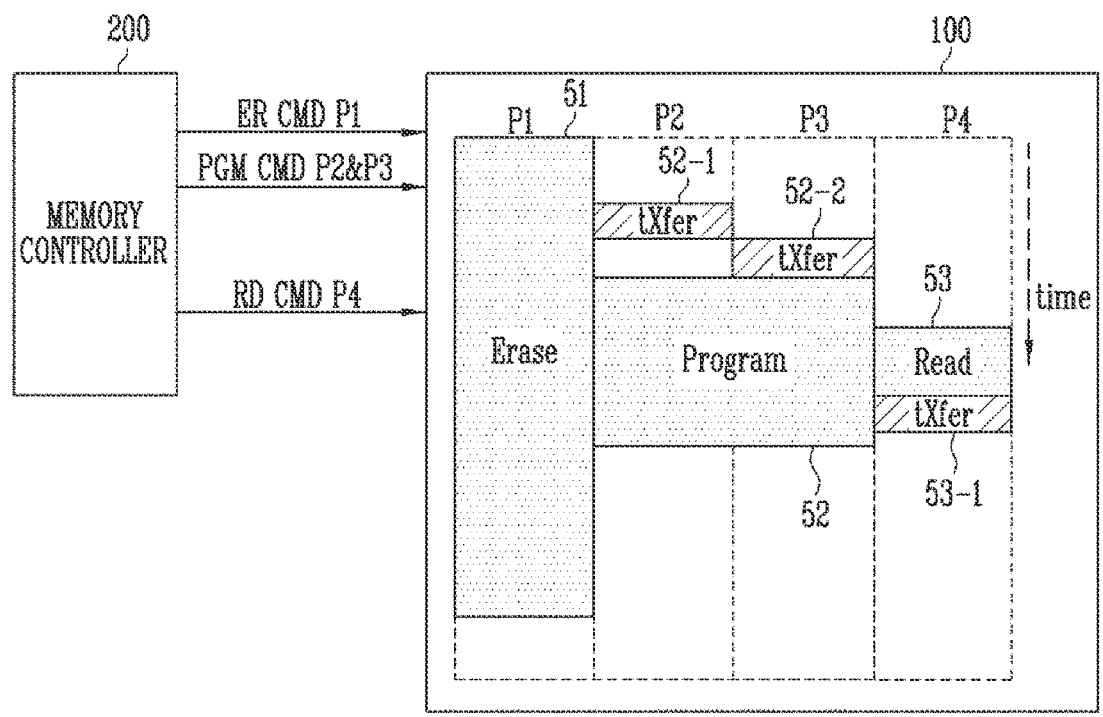
FIG. 5 is a diagram illustrating an internal operation of a memory device according to an embodiment of the present disclosure.

FIG. 5 is a diagram illustrating an internal operation of a memory device according to an embodiment of the present disclosure.

Referring to FIG. 5, the internal operation that is performed in the memory device 100 when the erase command, the program command, and the read command are sequentially input from the memory controller 200 is shown over time.

When a subsequent command that initiates the internal operation (for example, the program operation or the read operation) is input from the memory controller 200 to the memory device 100 while the memory device 100 is performing the erase operation, the memory device 100 may simultaneously perform the erase operation and the internal operation that correspond to the subsequent command.

Specifically, the memory device 100 may receive an erase command ER CMD P1 from the memory controller 200, In addition, the memory device 100 may perform an erase operation 51 on the first plane in response to the input command. In addition, when a subsequent command PGM CMD P2&P3 is input from the memory controller 200 while the memory device 100 is performing the erase operation 51, the memory device 100 may simultaneously perform the erase operation 51 and a program operation 52.

Meanwhile, the memory device 100 may simultaneously start the program operations or the erase operations that are performed on two or more planes. After sequentially receiving data to be written in two or more planes to each page buffer circuit, the memory device 100 may simultaneously begin performing the program operation. For example, the memory device 100 may receive a program command PGM CMD P2&P3 for the second plane and the third plane from the memory controller 200. In addition, in response to the input command, the memory device 100 may store data for the second plane in the second page buffer circuit and may store data for the third plane in the third page buffer circuit. After all data for respective planes is input, the memory device 100 may simultaneously begin performing the program operation on the second plane and the third plane. Here, tXfer may refer to a time in which data is input/output to the memory device 100 through the input/output circuit 125. The plurality of planes may share the input/output circuit 125 to sequentially input/output data for respective planes.

In FIG. 5, for convenience of description, the program operations that are performed on two or more planes are shown, but the erase operations that are performed on two or more planes may be performed in the same method.

While the memory device 100 performs the erase operation 51 and the program operation 52, when a subsequent command RD CMD P4 is input, the memory device 100 may simultaneously perform the erase operation 51, the program operation 52, and a read operation 53 on the fourth plane.

Figure 6:
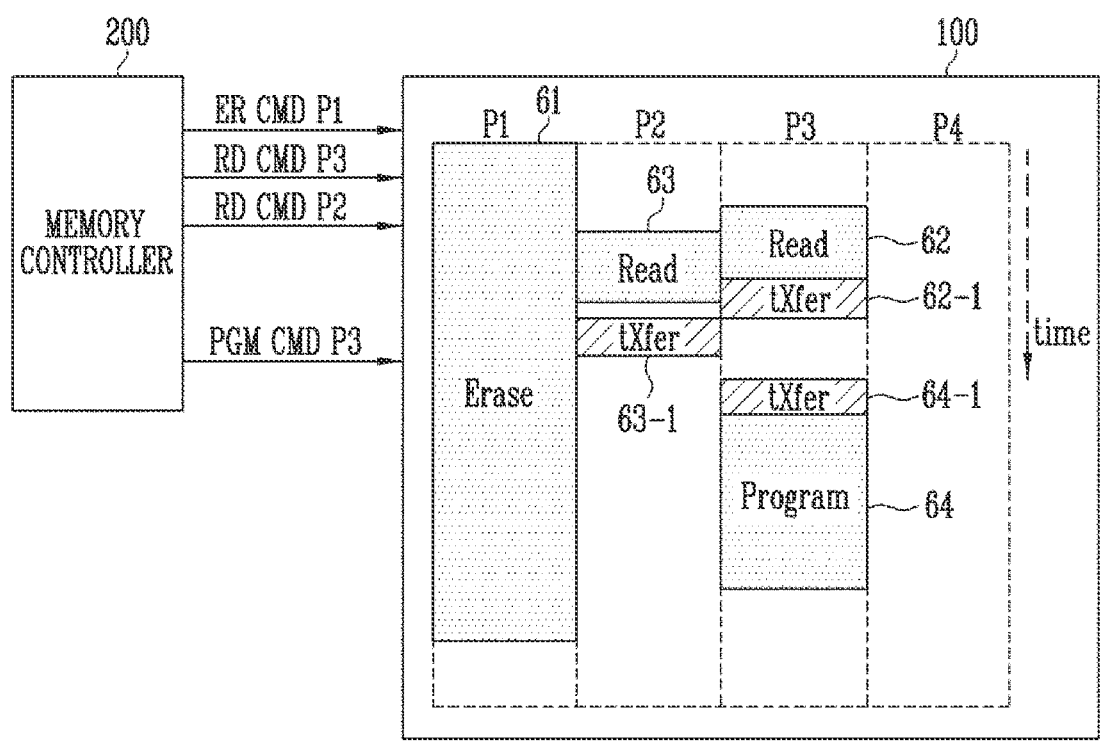
FIG. 6 is a diagram illustrating an internal operation of a memory device according to another embodiment of the present disclosure.

FIG. 6 is a diagram illustrating an internal operation of a memory device according to another embodiment of the present disclosure.

Referring to FIG. 6, the internal operation that is performed in the memory device 100 when the erase command, a plurality of read commands, and the program command are sequentially input from the memory controller 200 is shown over time.

The memory device 100 may receive the erase command ER CMD P1 from the memory controller 200. In addition, the memory device 100 may perform an erase operation 61 on the first plane in response to the input command. In addition, when a subsequent command RD CMD P3 is input from the memory controller 200 while the memory device 100 is performing the erase operation 61, the memory device 100 may simultaneously perform the erase operation 61 and a read operation 62.

Meanwhile, the memory device 100 may simultaneously perform the read operations on two or more planes. The memory device 100 may include a plurality of read operation controllers for respective planes and may individually control the read operations on each plane by using the plurality of read operation controllers. For example, the memory device 100 may perform the read operation 62 in response to the read command RD CMD P3 for the third plane input from the memory controller 200. In addition, when a read command RD CMD P2 is input while the memory device 100 is performing the read operation 62, the memory device 100 may simultaneously perform the read operation 62 on the third plane and a read operation 63 on the second plane. The memory device 100 may output data that is read from the third plane by using the input/output circuit 125 (62-1) and may sequentially output data that is read from the second plane (63-1).

Figure 7:
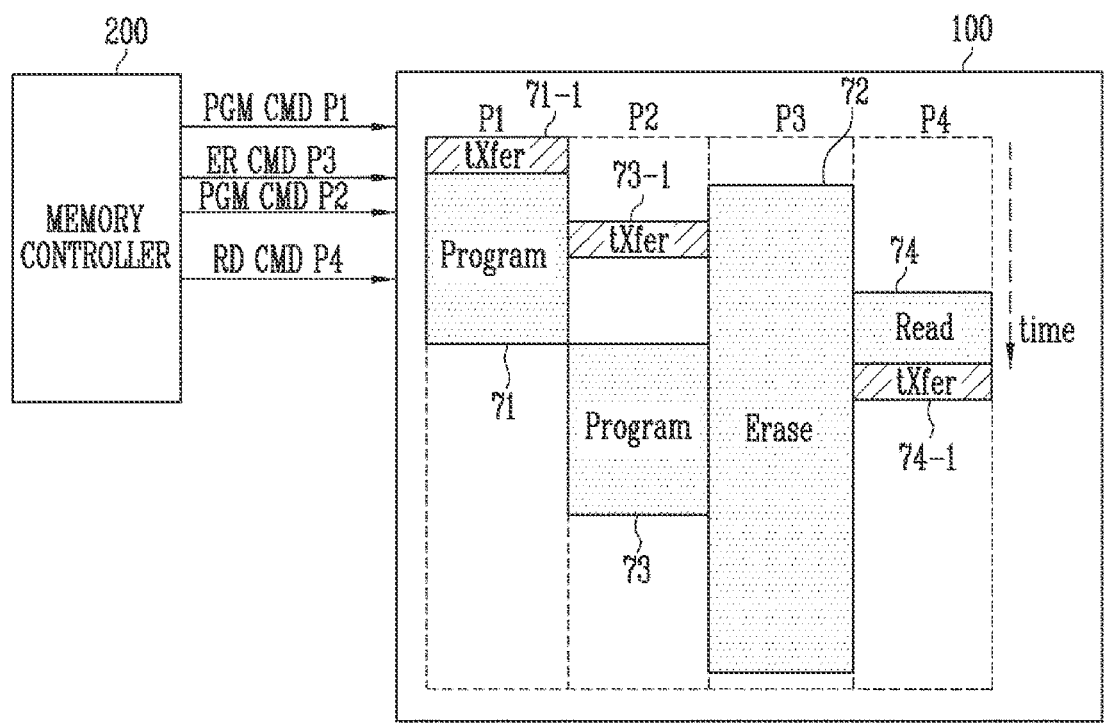
FIG. 7 is a diagram illustrating an internal operation of a memory device according to another embodiment of the present disclosure.

While the memory device 100 is performing the erase operation 61, when a subsequent command PGM CMD P3 is input, the memory device 100 may simultaneously perform the erase operation 61 and a program operation 64 on the third plane, FIG. 7 is a diagram illustrating an internal operation of a memory device according to another embodiment of the present disclosure.

Referring to FIG. 7, the internal operation that is performed in the memory device 100 when a plurality of program commands, the erase command, and the read command are sequentially input from the memory controller 200 is shown over time.

When a subsequent command that initiates the program operation is input from the memory controller 200 to the memory device 100 while the memory device 100 is performing the program operation, the memory device 100 may hold the start of the program operation that corresponds to the subsequent command.

Specifically, the memory device 100 may receive a program command PGM CMD P1 from the memory controller 200. In addition, after receiving data 71-1, the memory device 100 may perform a program operation 71 on the first plane. When a subsequent command PGM CMD P2 is input from the memory controller 200 while the memory device 100 is performing the program operation 71, the memory device 100 may hold the start of the program operation 73 according to the subsequent command. In addition, since the memory device 100 performs the program operation according to an input order, the memory device 100 may perform the program operation 73 according to the subsequent command PGM CMD P2 when the program operation 71 in progress has ended. Meanwhile, the memory device 100 may store the subsequent command PGM CMD P2 that is input during the program operation in the standby operation storage 185. In addition, when the program operation 71 in progress has ended, the subsequent command PGM CMD P2 that is stored in the standby operation storage 185 may be returned to the program operation controller 181, and the program operation 73 may be performed.

Since the program operation and the erase operation or the program operation and the read operation may be simultaneously performed, when the memory device 100 receives an erase command ER CMD P3 and a read command RE CMD P4 while performing the program operation 71, the memory device 100 may simultaneously perform the program operation 71, an erase operation 72, and a read operation 74.

In FIG. 7, for convenience of description, the case in which the subsequent program command is input during the program operation is shown, but the same method may be applied to the case in which the subsequent erase command is input during the erase operation.

Figure 8:
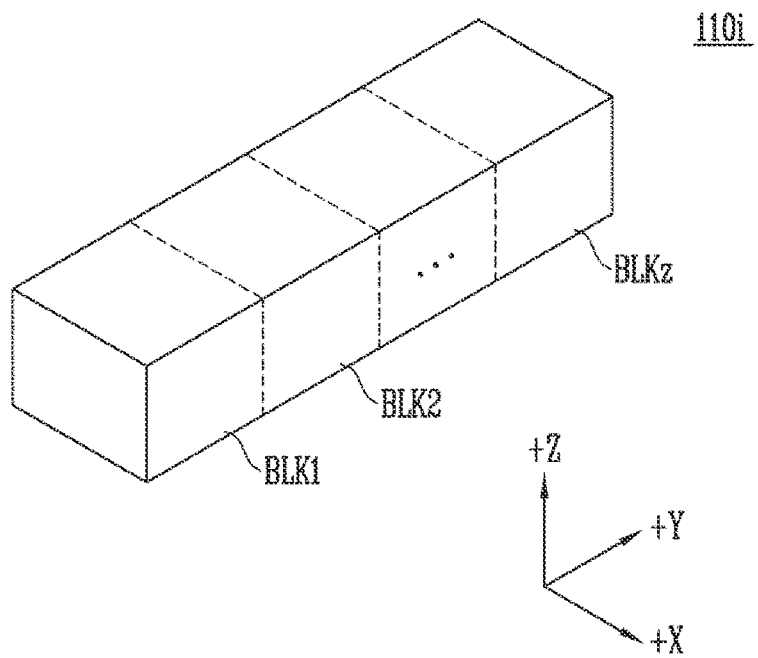
FIG. 8 is a diagram illustrating a memory cell array according to an embodiment of the present disclosure.

FIG. 8 is a diagram illustrating a memory cell array according to an embodiment of the present disclosure.

Referring to FIG. 8, the memory cell array 110$i$ may include a plurality of memory blocks BLK1 to BLKz. The memory cell array 110$i$, shown in FIG. 8, may mean a memory cell array that corresponds to any one of the first plane 110$a$ to the fourth plane 110$d$, shown in FIG. 2.

Each memory block may be formed in a three-dimensional structure, and each memory block may include a plurality of memory cells that are stacked on a substrate. The plurality of memory cells may be arranged along a +X direction, a +Y direction, and a +Z direction. The structure of each memory block is described in more detail with reference to FIGS. 9 to 11.

Figure 9:
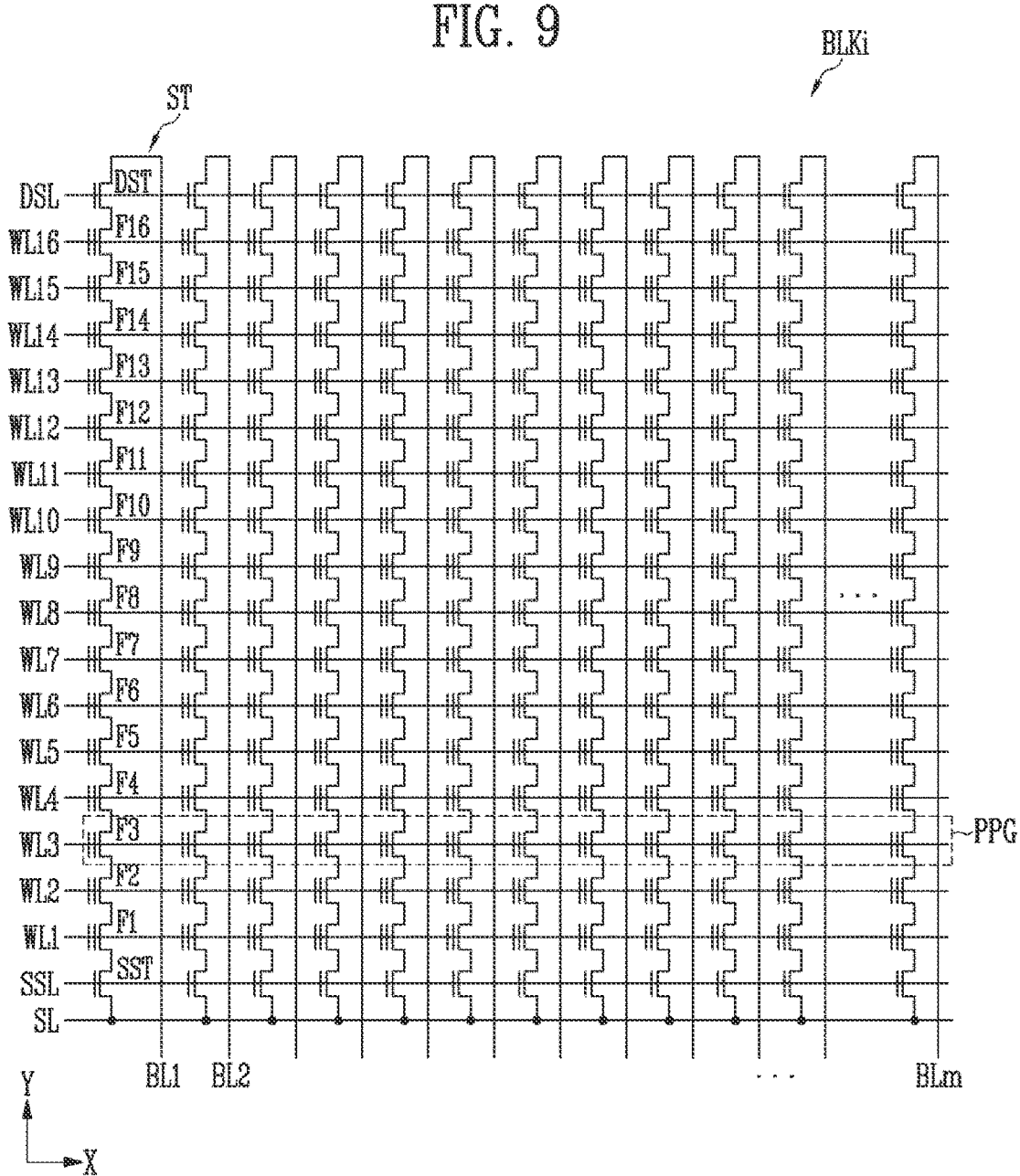
FIG. 9 is a diagram illustrating a memory block according to an embodiment of the present disclosure.

FIG. 9 is a diagram illustrating a structure of a memory block according to an embodiment of the present disclosure.

Referring to FIG. 9, in the memory block BLKi, a plurality of word lines that are arranged, in parallel, with each other may be connected between a first select line and a second select line, Here, the first select line may be a source select line SSL, and the second select line may be a drain select line DSL. More specifically, the memory block BLKi may include a plurality of strings ST that are connected between bit lines BL1 to BLm and a source line SL. The bit lines BL1 to BLm may be connected to the strings ST, respectively, and the source line SL may be commonly connected to the strings ST, Since the strings ST may be configured to be identical to each other, a string ST that is connected to the first bit line BL1 is specifically described as an example.

The string ST may include a source select transistor SST, a plurality of memory cells MC1 to MC16, and a drain select transistor DST that are connected in series between the source line SL and the first bit line BL1. One string ST may include at least one source select transistor SST and at least one drain select transistor DST and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST that are included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells that is connected to the same word line among the memory cells that are included in different strings ST may be referred to as a physical page PPG. Therefore, the memory block BLKi may include the physical pages PPG of the number of the word lines WL1 to WL16.

Each of the memory cells may be configured as the SLC that stores one data bit, the MLC that stores two data bits, the TLC that stores three data bits, or the QLC capable of storing four data bits.

The SLC may store one bit of data, One physical page PPG of the SLC may store one logical page (LPG) data. One logical page (LPG) data may include data bits that correspond to the number of cells that are included in one physical page PPG.

The MLC, the TLC, and the QLC may store two or more bits of data. In this case, one physical page PPG may store two or more logical page (LPG) data.

Figure 10:
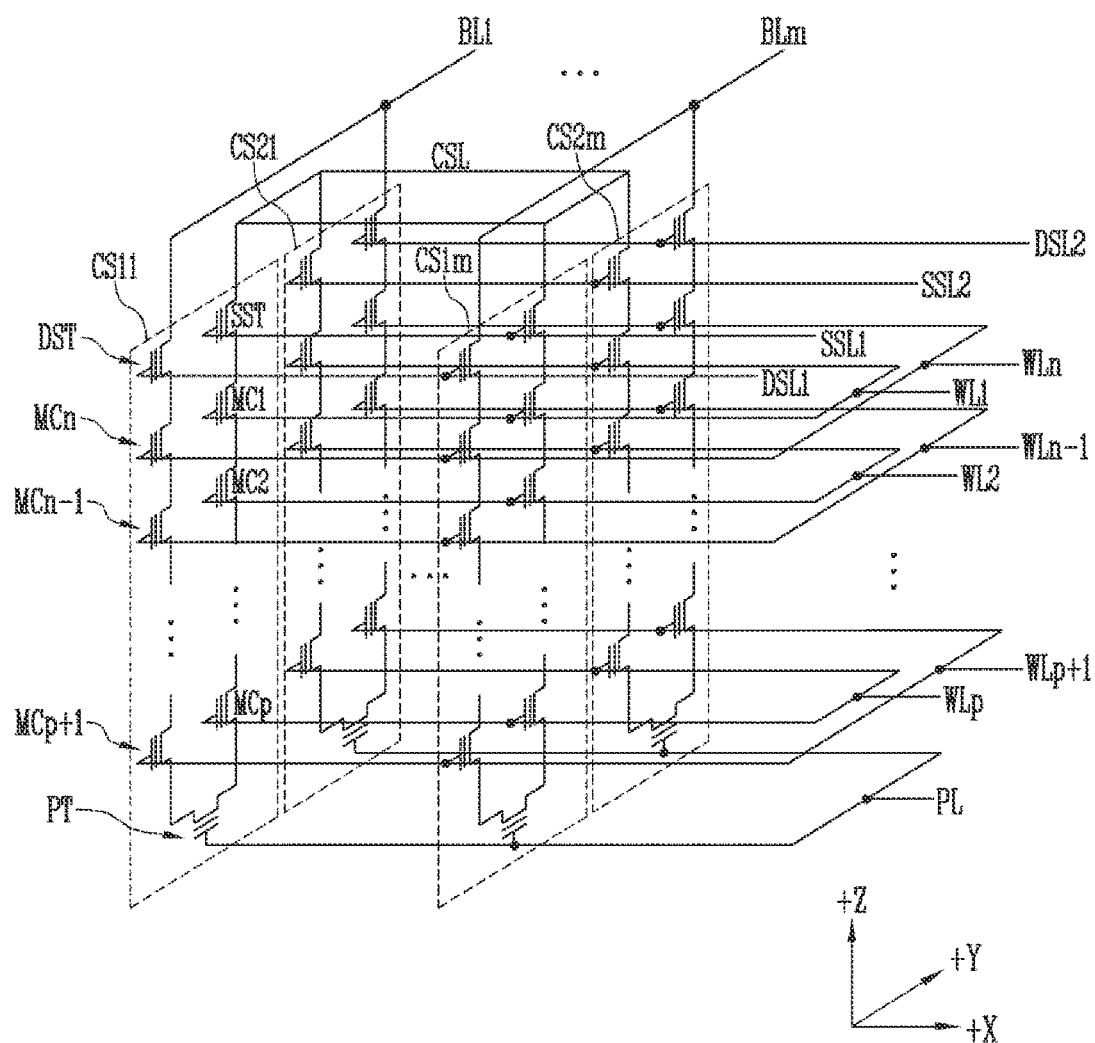
FIG. 10 is a diagram illustrating a memory block according to another embodiment of the present disclosure.

FIG. 10 is a diagram illustrating a memory block according to another embodiment of the present disclosure.

Referring to FIG. 10, any one memory block BLKa among the memory blocks BLK1 to BLKz of FIG. 8 is shown. The memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a shape. In the memory block BLKa, m cell strings may be arranged in a row direction (that is, the +X direction).

Meanwhile, in FIG. 10, two cell strings may be arranged in a column direction (that is, the +Y direction), but this is for convenience of description, and it is obvious that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing a channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be connected between a common source line CSL and memory cells MC1 to MCp.

In an embodiment, source select transistors of cell strings that are arranged in the same row may be connected to a source select line extending in the row direction, and source select transistors of cell strings that are arranged in different rows may be connected to different source select lines. Referring to FIG. 10, source select transistors of cell strings CS11 to CS1$m$ of a first row may be connected to a first source select line SSL1. Source select transistors of cell strings CS21 to CS2$m$ of a second row may be connected to a second source select line SSL2.

In another embodiment, the source select transistors of the cell strings CS11 to CS1$m$ and CS21 to CS2$m$ may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a direction reverse to the +Z direction and may be connected between the source select transistor SST and the pipe transistor PT in series. The (p+1)-th to n-th memory cells MCp+1 to MCn may be sequentially arranged in the +Z direction and may be connected between the pipe transistor PT and the drain select transistor DST in series. The first to p-th memory cells MC1 to MCp and the (p+1)-th to n-th memory cells MCp+1 to MCn may be connected through the pipe transistor PT. Gates of the first to n-th memory cells MC1 to MCn of each cell string may be connected to first to n-th word lines WL1 to WLn, respectively.

A gate of the pipe transistor PT of each cell string may be connected to a pipe line PL.

The drain select transistor DST of each cell string may be connected between a corresponding bit line and the memory cells MCp+1 to MCn. Cell strings that are arranged in the row direction may be connected to the drain select line extending in the row direction. Drain select transistors of the cell strings CS11 to CS1$m$ of the first row may be connected to a first drain select line DSL1. Drain select transistors of the cell strings CS21 to CS2$m$ of the second row may be connected to a second drain select line DSL2.

Cell strings that are arranged in the column direction may be connected to bit lines extending in the column direction. Referring to FIG. 10, the cell strings CS11 and CS21 of a first column may be connected to the first bit line BL1, The cell strings CS1$m$ and CS2$m$ of an m-th column may be connected to the m-th bit line BLm.

Memory cells that are connected to the same word line within the cell strings that are arranged in the row direction may configure one page. For example, the memory cells that are connected to the first word line WL1 among the cell strings CS11 to CS1$m$ of the first row may configure one page. The memory cells that are connected to the first word line WL1 among the cell strings CS21 to CS2$m$ of the second row may configure another page. The cell strings that are arranged in one row may be selected by selecting one of the drain select lines DSL1 and DSL2. In addition, one page among the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1$m$ or CS21 to CS2$m$ that are arranged in the row direction may be connected to the even bit lines, respectively, and odd-numbered cell strings among the cell strings CS11 to CS1$m$ or CS21 to CS2$m$ that are arranged in the row direction may be connected to the odd bit lines, respectively.

In an embodiment, at least one of the first to n-th memory cells MC1 to MCn may be used as a dummy memory cell. For example, at least one dummy memory cells may be provided to reduce an electric field between the source select transistor SST and the memory cells MC1 to MCp. Alternatively, at least one dummy memory cells may be provided to reduce an electric field between the drain select transistor DST and the memory cells MCp+1 to MCn. As more dummy memory cells are provided, reliability of an operation for the memory block BLKa may be improved, but a size of the memory block BLKa may increase. As less dummy memory cells are provided, the size of the memory block BLKa may decrease, but the reliability of the operation for the memory block BLKa may be reduced.

In order to efficiently control at least one dummy memory cells, each of the dummy memory cells may have a required threshold voltage. Before or after an erase operation on the memory block BLKa, program operations on all or some of the dummy memory cells may be performed. When the erase operation is performed after the program operation is performed, the dummy memory cells may have the required threshold voltage by controlling a voltage that is applied to dummy word lines that are connected to the respective dummy memory cells.

Figure 11:
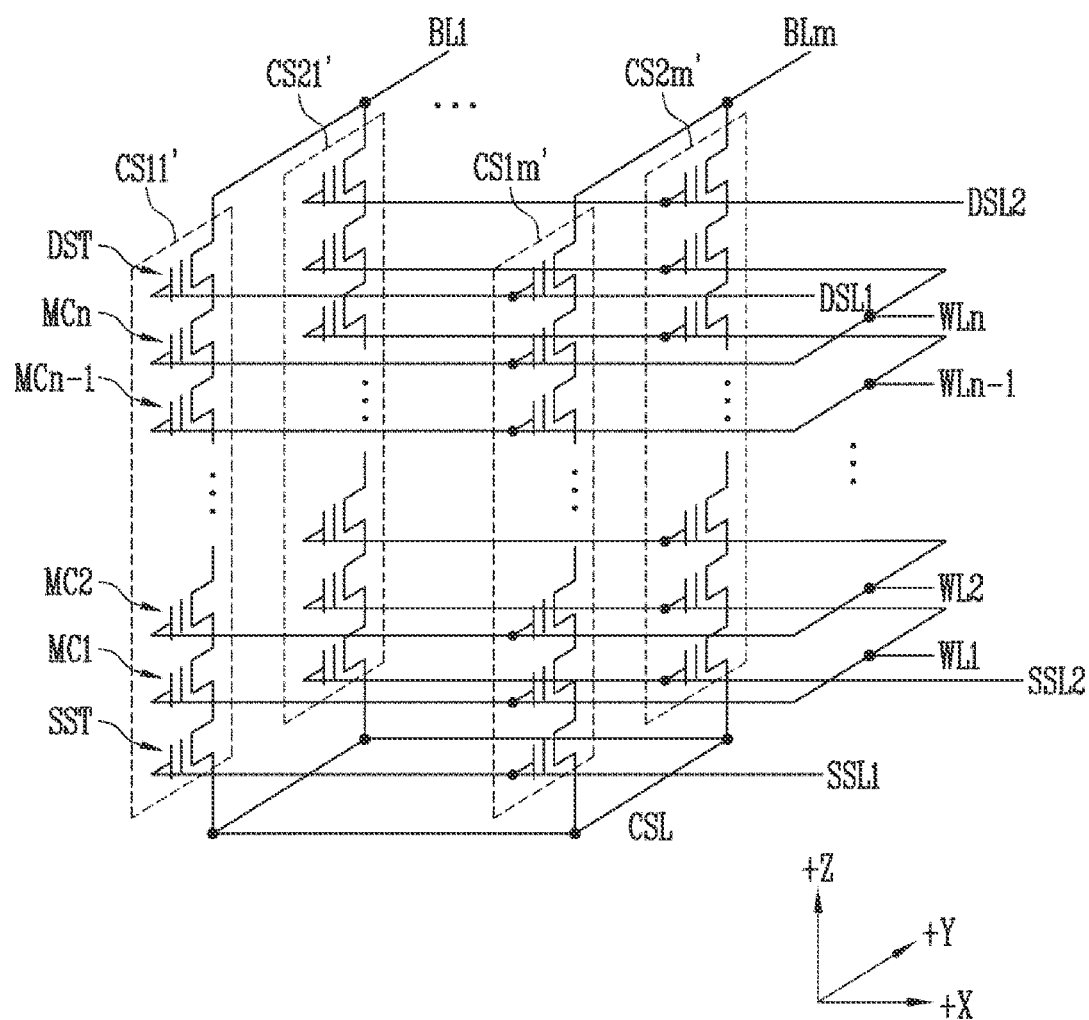
FIG. 11 is a diagram illustrating a memory block according to another embodiment of the present disclosure.

FIG. 11 is a diagram illustrating a memory block according to another embodiment of the present disclosure.

Referring to FIG. 11, another embodiment of a memory block BLKb among the memory blocks BLK1 to BLKz of FIG. 8 is shown. The memory block BLKb may include a plurality of cell strings CS11' to CS1m' and CS21' to CS2m'. Each of the plurality of cell strings CS11' to CS1m' and CS21' to CS2m' may extend along the +Z direction. Each of the plurality of cell strings CS11' to CS1m' and CS21' to CS2m' may include at least one source select transistor SST, first to n-th memory cells MC1 to MCn, and at least one drain select transistor DST, which are stacked on a substrate (not shown) under the memory block BLK1b.

The source select transistor SST of each cell string may be connected between the common source line CSL and the memory cells MC1 to MCn, Source select transistors of cell strings that are arranged in the same row may be connected to the same source select line. Source select transistors of cell strings CS11' to CS1m' that are arranged in the first row may be connected to the first source select line SSL1. Source select transistors of the cell strings CS21' to CS2m' that are arranged in the second row may be connected to the second source select line SSL2, In another embodiment, the source select transistors of the cell strings CS11' to CS1m' and CS21' to CS2m' may be commonly connected to one source select line.

The first to n-th memory cells MC1 to MCn of each cell string may be connected between the source select transistor SST and the drain select transistor DST in series. The gates of the first to n-th memory cells MC1 to MCn may be connected to the first to n-th word lines WL1 to WLn, respectively.

The drain select transistor DST of each cell string may be connected between a corresponding bit line and the memory cells MC1 to MCn. The drain select transistors of the cell strings that are arranged in the row direction may be connected to the drain select line extending in the row direction. The drain select transistors of the cell strings CS11' to CS1m' of the first row may be connected to the first drain select line DSL1. The drain select transistors of the cell strings CS21' to CS2m' of the second row may be connected to the second drain select line DSL2.

As a result, the memory block BLKb of FIG. 11 may have an equivalent circuit similar to that of the memory block BLKa of FIG. 9 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' that are arranged in the row direction may be connected to the even bit lines, respectively, and odd-numbered cell strings among the cell strings CS11' to CS1m' or CS21' to CS2m' that are arranged in the row direction may be connected to the odd bit lines, respectively.

In an embodiment, at least one of the first to n-th memory cells MC1 to MCn may be used as a dummy memory cell. For example, at least one dummy memory cells may be provided to reduce an electric field between the source select transistor SST and the memory cells MC1 to MCn. Alternatively, at least one dummy memory cells may be provided to reduce an electric field between the drain select transistor DST and the memory cells MC1 to MCn. As more dummy memory cells are provided, reliability of an operation for the memory block BLKb may be improved, but a size of the memory block BLKb may increase. As less dummy memory cells are provided, the size of the memory block BLKb may decrease, but the reliability of the operation for the memory block BLKb may be reduced.

In order to efficiently control at least one dummy memory cells, each of the dummy memory cells may have a required threshold voltage. Before or after an erase operation on the memory block BLKb, program operations on all or some of the dummy memory cells may be performed. When the erase operation is performed after the program operation is performed, the dummy memory cells may have the required threshold voltage by controlling a voltage that is applied to dummy word lines that are connected to the respective dummy memory cells.

Figure 12:
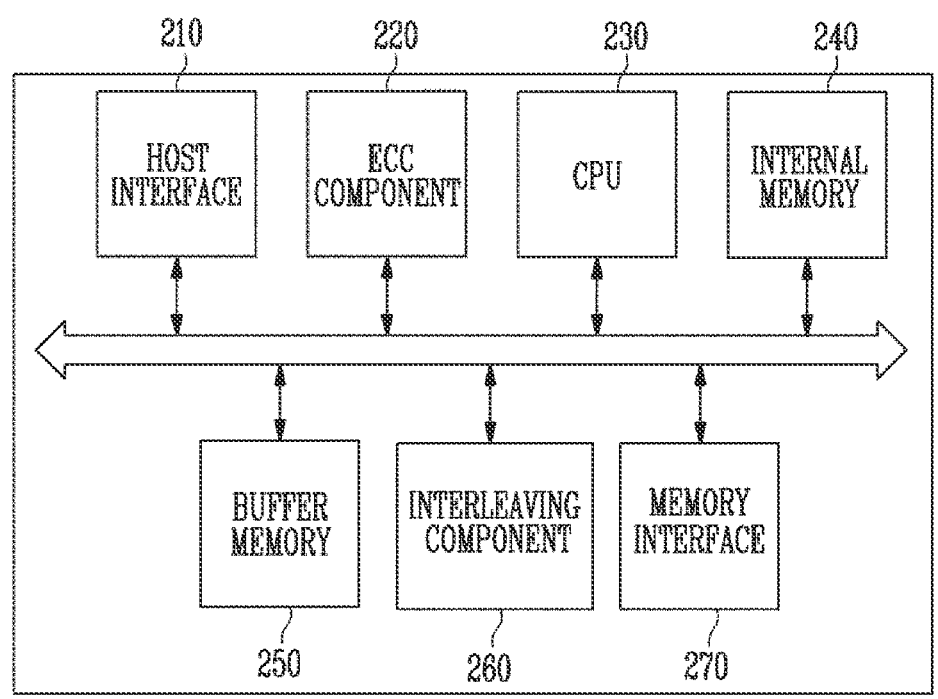
FIG. 12 is a block diagram illustrating a memory controller according to an embodiment of the present disclosure.

FIG. 12 is a block diagram Illustrating a memory controller according to an embodiment of the present disclosure.

Referring to FIG. 12, the memory controller 200 may include a host interface 210, an ECC component 220, a CPU 230, an internal memory 240, a buffer memory 250, an interleaving component 260, and a memory interface 270.

The host interface 210 may include a protocol for exchanging data between the host 2000 and the memory controller 200. Specifically, the host interface 210 may be configured to communicate with the host 2000 through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The ECC component 220 may detect an error during the program operation or the read operation and correct the detected error. Specifically, the ECC component 220 may perform an error correction operation according to an error correction code (ECC). In addition, the ECC component 220 may perform error correction encoding (ECC encoding) based on data to be written in the memory device 100. The data on which the error correction encoding is performed may be transferred to the memory device 100 through the memory interface 270. In addition, the ECC component 220 may perform error correction decoding on data that is received from the memory device 100 through the memory interface 270.

The CPU 230 may communicate with the host 2000 by using the host interface 210 and perform a logical operation to control an operation of the memory controller 200, For example, the CPU 230 may load a program command, a data file, a data structure, and the like, perform various operations, or generate a command and an address, based on a request that is received from the host 2000 or an external device. For example, the CPU 230 may generate a program command, a read command, and an erase command for performing the program operation, the read operation, and the erase operation. In addition, the CPU 230 may generate addresses for performing the program operation, the read operation, and the erase operation.

In addition, the CPU 230 may perform a function of a flash translation layer (FTL). The CPU 230 may convert a logical block address (LBA) provided by the host into a physical block address (PBA) through the FTL. The FTL may receive the LBA, and convert the LBA into the PBA by using a mapping table. An address mapping method of the FTL may include various methods according to a mapping unit. A representative address mapping method includes a page mapping method, a block mapping method, and a hybrid mapping method.

In addition, the CPU 230 may generate a command without a request of the host 2000. For example, the CPU 230 may generate the command for background operations such as operations for wear leveling of the memory device 100 and operations for garbage collection of the memory device 100.

The internet memory 240 may be used as a storage for storing various pieces of information necessary for the operation of the controller 200. Specifically, the internal memory 240 may include a map table, and physical-logical address information and logical-physical address information may be stored in the map table. In addition, the internal memory 240 may be controlled by the CPU 230.

The buffer memory 250 may be used as an operation memory or a cache memory of the CPU 230. In addition, the buffer memory 250 may store codes and commands executed by the CPU 230. The buffer memory 250 may store data that is processed by the CPU 230. In addition, the buffer memory 250 may be implemented by with a static RAM (SRAM) or a dynamic RAM (DRAM) when the buffer memory 250 is implemented.

The interleaving component 260 may recognize an operation that is performed by each of memory units that is included in the memory device 100. Here, the operation may be any one of the program operation, the read operation, and the erase operation. Specifically, the interleaving component 260 may receive information on a progress or an end of the operation that is performed by the memory device 100 from the memory device 100 through the memory interface 270, and recognize the operation that is performed by the memory device 100 based on the received information. According to an embodiment of the present disclosure, the interleaving component 260 may recognize the operation that is performed by the memory device 100 from the individual operation controller 170 or the common operation controller 180 that is included in the control logic 160. Specifically, the interleaving component 260 may receive information on the read operation that is being performed and the plane on which the read operation is performed from the individual operation controller 170. In addition, the interleaving component 260 may receive information on the program operation that is being performed or the erase operation that is being performed from the common operation controller 180. In addition, the interleaving component 260 may recognize the held program operation or erase operation based on the command stored in the standby operation storage 185.

The memory interface 270 may communicate with the memory device 100 by using a communication protocol based on the CPU 230. Specifically, the memory interface 270 may communicate the command, the address, and the data with the memory device 100 through a channel.

Figure 13:
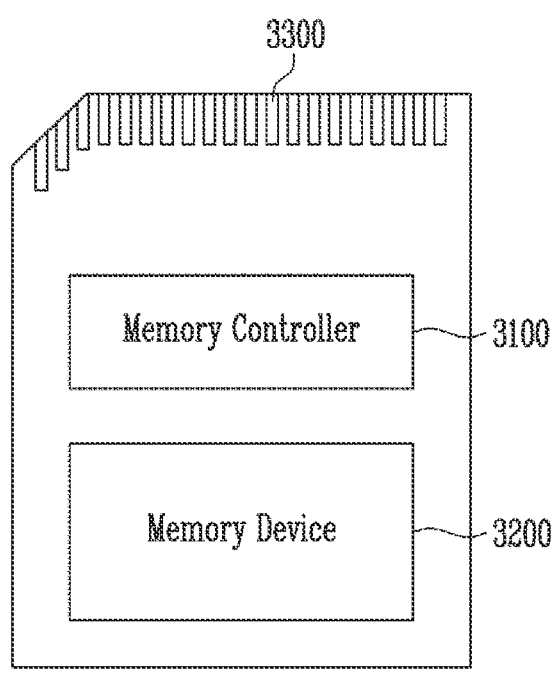
FIG. 13 is a diagram illustrating a memory card system according to an embodiment of the present disclosure.

FIG. 13 is a diagram illustrating a memory card system according to an embodiment of the present disclosure.

Referring to FIG. 13, the memory card system 3000 may include a memory controller 3100, a memory device 3200, and a connector 3300.

The memory controller 3100 may be electrically connected to the memory device 3200, and the memory controller 3100 may be configured to access the memory device 3200. For example, the memory controller 3100 may be configured to control a read operation, a write operation, an erase operation, and a background operation for the memory device 3200. The memory controller 3100 may be configured to provide an interface between the memory device 3200 and a host. In addition, the memory controller 3100 may drive firmware for controlling the memory device 3200.

For example, the memory controller 3100 may include components such as a random access memory (RAM), a processor, a host interface, a memory interface, and an error correction circuit.

The memory controller 3100 may communicate with an external device through the connector 3300. The memory controller 3100 may communicate with an external device (for example, the host) according to a specific communication standard. For example, the memory controller 3100 may be configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards described above.

For example, the memory device 3200 may be complemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 3100 and the memory device 3200 may be integrated into one semiconductor device to configure a memory card. For example, the memory controller 3100 and the memory device 3200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
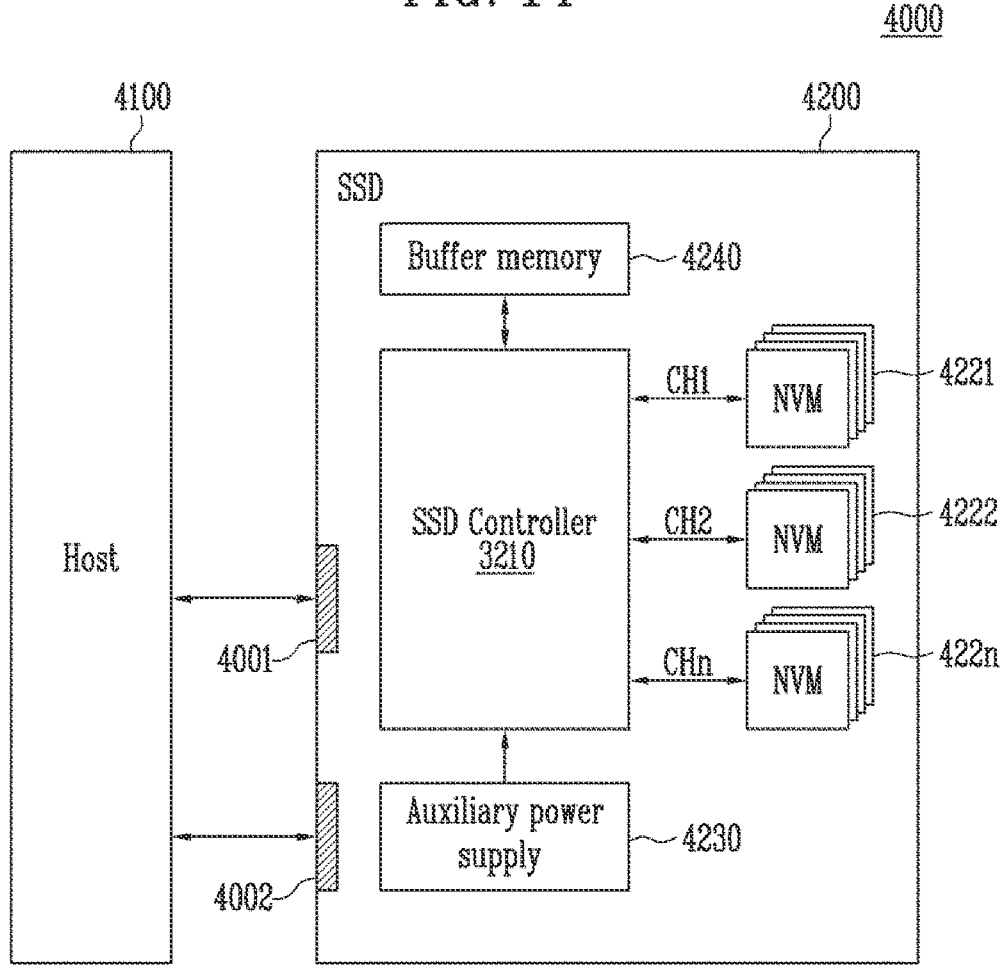
FIG. 14 is a diagram illustrating a solid state drive (SSD) system according to an embodiment of the present disclosure.

FIG. 14 is a diagram illustrating a solid state drive (SSD) system according to an embodiment of the present disclosure.

Referring to FIG. 14, the SSD system 4000 may include a host 4100 and an SSD 4200. The SSD 4200 may exchange a signal SIG with the host 4100 through a signal connector 4001 and receive power PWR through a power connector 4002. The SSD 4200 may include an SSD controller 3210, a plurality of flash memories 4221 to 422n, an auxiliary power devise supply 4230, and a buffer memory 4240.

In an embodiment, the SSD controller 4210 may perform a function of the memory controller 200 described with reference to FIG. 1. The SSD controller 4210 may control the plurality of flash memories 4221 to 422n in response to the signal SIG that is received from the host 4100. For example, the signal SIG may be signals based on an interface between the host 4100 and the SSD 4200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 4230 may be connected to the host 4100 through the power connector 4002. The auxiliary power device 4230 may receive the power PWR from the host 4100 and may charge the power. The auxiliary power device 4230 may provide power of the SSD 4200 when power supply from the host 4100 is not smooth. For example, the auxiliary power device 4230 may be positioned in the SSD 4200 or may be positioned outside the SSD 4200. For example, the auxiliary power device 4230 may be positioned on a main board and may provide auxiliary power to the SSD 4200.

The buffer memory 4240 operates as a buffer memory of the SSD 4200. For example, the buffer memory 4240 may temporarily store data that is received from the host 4100 or data that is received from the plurality of flash memories 4221 to 422n or may temporarily store metadata (for example, a mapping table) of the flash memories 4221 to 422n. The buffer memory 4240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 15:
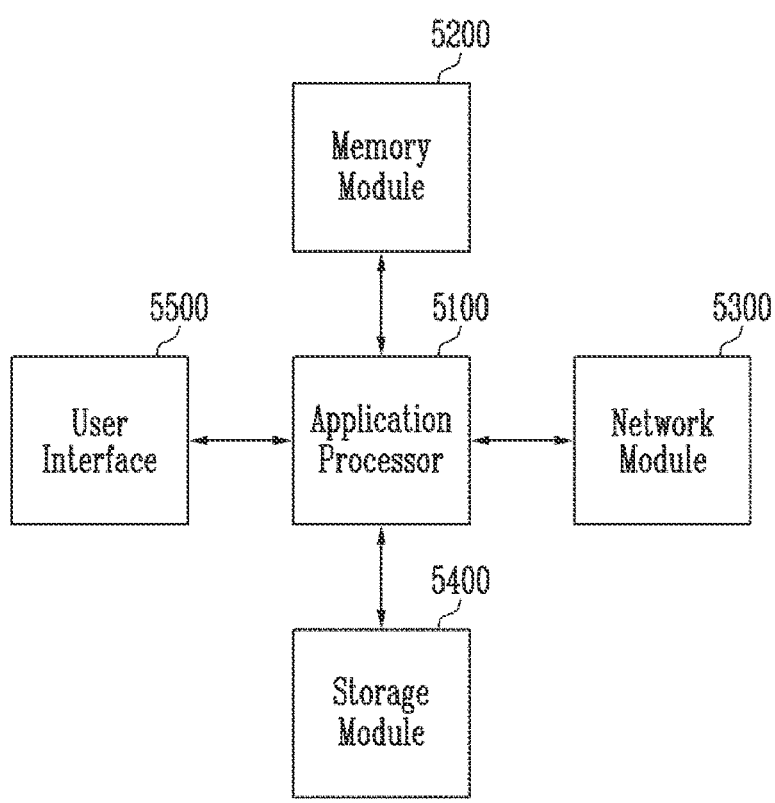
FIG. 15 is a diagram illustrating a user system according to an embodiment of the present disclosure.

FIG. 15 is a diagram illustrating a user system according to an embodiment of the present disclosure.

Referring to FIG. 15, the user system 5000 may include an application processor 5100, a memory module 5200, a network module 5300, a storage module 5400, and a user interface 5500.

The application processor 5100 may drive components, an operating system (OS), a user program, or the like that is included in the user system 5000. For example, the application processor 5100 may include controllers, interfaces, graphics engines, and the like that control the components that are included in the user system 5000. The application processor 5100 may be provided as a system-on-chip (SoC).

The memory module 5200 may operate as a main memory, an operation memory, a buffer memory, or a cache memory of the user system 5000. The memory module 5200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 5100 and memory module 5200 may be packaged based on a package on package (POP) and provided as one semiconductor package.

The network module 5300 may communicate with external devices. For example, the network module 5300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, WI-FI and 5G (sub-6 GHz, mmWave). For example, the network module 5300 may be included in the application processor 5100.

The storage module 5400 may store data. For example, the storage module 5400 may store data that is received from the application processor 5100. Alternatively, the storage module 5400 may transmit data that is stored in the storage module 5400 to the application processor 5100. For example, the storage module 5400 may be implemented as a nonvolatile semiconductor memory element such as a phase-change RAM (PRAM), a magnetoresistive RAM (MRAM), a resistive RAM (RRAM), a NAND flash, a NOR flash, and a three-dimensional NAND flash. For example, the storage module 5400 may be provided as a removable storage device (removable drive), such as a memory card, and an external drive of the user system 5000.

For example, the storage module 5400 may include a plurality of nonvolatile memory devices, and the plurality of nonvolatile memory devices may operate identically to the memory device described with reference to FIGS. 1 to 12. The storage module 5400 may operate identically to the memory system 1000 described with reference to FIG. 1.

The user interface 5500 may include interfaces for inputting data or an instruction to the application processor 5100 or for outputting data to an external device. For example, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 5500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a plurality of planes, each with a plurality of memory cells;
   individual operation controllers configured to respectively control read operations on the plurality of planes;
   a common operation controller configured to control a program operation or an erase operation on any one of the plurality of planes;
   a command decoder configured to receive a plurality of commands and a plurality of addresses that respectively correspond to the plurality of commands from a memory controller, configured to provide a read command among the plurality of commands to an individual operation controller that controls a plane that is indicated by an address that corresponds to the read command among the individual operation controllers, and configured to provide a program command or an erase command among the plurality of commands to the common operation controller; and
   a peripheral circuit configured to generate operation voltages that are used for the read operations, the program operation, and the erase operation based on the individual operation controllers and the common operation controller,
   wherein, when at least two of the program command, the erase command, and the read command are received with respect to the plurality of planes, the command decoder provides the at least two commands to perform an operation that corresponds to the at least two commands, in parallel, and
   wherein one of the at least two commands is received when the memory device is operating in response to the other of the at least two commands.

2. The memory device of claim 1, wherein the command decoder provides an address that corresponds to the program command or the erase command among the plurality of addresses to the common operation controller.

3. The memory device of claim 1, wherein the peripheral circuit comprises a voltage generation circuit comprising:
   a read voltage generator configured to generate voltages that are used for the read operations;

a program voltage generator configured to generate voltages that are used for the program operation; and
an erase voltage generator configured to generate voltages that are used for the erase operation.

4. The memory device of claim 3, further comprising:
a row decoder connected between the voltage generation circuit and the plurality of planes,
wherein the row decoder includes a plurality of decoders that respectively correspond to the plurality of planes.

5. The memory device of claim 1, wherein the individual operation controllers correspond to first to fourth planes, respectively, and include first to fourth individual operation controllers that control the peripheral circuit to independently perform the read operations on the first to fourth planes.

6. The memory device of claim 1, wherein the common operation controller comprises:
a program operation controller configured to control the peripheral circuit to independently perform the program operation on the plurality of planes;
an erase operation controller configured to control the peripheral circuit to independently perform the erase operation on the plurality of planes; and
a standby operation storage configured to store a program command that is input while the program operation is being performed and configured to store an erase command that is input while the erase operation is being performed.

7. The memory device of claim 1, wherein, when a subsequent command that initiates a further program operation is input while the program operation is being performed, the common operation controller holds a start of the further program operation that corresponds to the subsequent command.

8. The memory device of claim 1, wherein, when a subsequent command that initiates a further erase operation is input while the erase operation is being performed, the common operation controller holds a start of the further erase operation that corresponds to the subsequent command.

9. The memory device of claim 1, wherein, while the erase operation or the program operation is being performed on at least one of the plurality of planes, when a read command for remaining planes except for the at least one plane is input, the common operation controller controls the peripheral circuit to perform a read operation on the remaining planes.

10. The memory device of claim 1, wherein, while the program operation is being performed on at least one of the plurality of planes, when an erase command for remaining planes except for the at least one plane is input, the common operation controller controls the peripheral circuit to perform an erase operation on the remaining planes.

11. The memory device of claim 1, wherein, while the erase operation is being performed on at least one of the plurality of planes, when a program command for remaining planes except for the at least one plane is input, the common operation controller controls the peripheral circuit to perform a program operation on the remaining planes.

12. A memory device comprising:
a memory cell array with a plurality of planes;
a peripheral circuit configured to perform a read operation, a program operation, or an erase operation on memory cells that are included in the plurality of planes, respectively; and
a control logic configured to control the memory cell array and the peripheral circuit to perform an operation that corresponds to at least two commands, in parallel, when receiving the at least two commands among a program command that initiates the program operation on the plurality of planes, an erase command that initiates the erase operation on the plurality of planes, or a read command that initiates the read operation on the plurality of planes from a memory controller,
wherein, when a subsequent command that initiates a further program operation is input while the program operation is being performed, the control logic holds a start of the further program operation that corresponds to the subsequent command, and
wherein, when a subsequent command that initiates a further erase operation is input while the erase operation is being performed, the control logic holds a start of the further erase operation that corresponds to the subsequent command.

13. The memory device of claim 12, wherein the control logic comprises:
an individual operation controller configured to control the read operation on the plurality of planes;
a common operation controller configured to control the program operation or the erase operation on the plurality of planes; and
a standby operation storage configured to store the program command that is input while the program operation is being performed and configured to store the erase command that is input while the erase operation is being performed.

14. The memory device of claim 13, wherein the plurality of planes includes first to fourth planes, and
wherein the individual operation controller includes first to fourth read operation controllers that control the peripheral circuit to independently perform the read operation on the first to fourth planes.

15. The memory device of claim 12, wherein the peripheral circuit comprises:
a read voltage generator configured to generate voltages that are used for the read operation;
a program voltage generator provided separately from the read voltage generator and configured to generate voltages that are used for the program operation; and
an erase voltage generator provided separately from the read voltage generator or the program voltage generator and configured to generate voltages that are used for the erase operation.

16. The memory device of claim 12, wherein the peripheral circuit includes a plurality of decoders that are connected to the memory cell array, respectively corresponding to the plurality of planes.

17. The memory device of claim 12, further comprising:
page buffer groups connected to the memory cell array and configured to buffer data,
wherein the page buffer groups include a plurality of page buffers that respectively correspond to the plurality of planes.

18. A memory device comprising:
a plurality of planes, each with a plurality of memory cells;
individual operation controllers configured to respectively control read operations on the plurality of planes; and
a common operation controller configured to control a program operation or an erase operation on any one of the plurality of planes,
wherein different operations are capable of being respectively performed on different planes among the plurality of planes at the same time, wherein, when at least two of a program command, an erase command, and a read command are received with respect to the plurality of planes, wherein the at least two commands are provided to perform an operation that corresponds to the at least two commands, in parallel, and wherein one of the at least two commands is received when the memory device is operating in response to the other of the at least two commands.

* * * * *